United States Patent
Hsu et al.

(10) Patent No.: US 7,750,874 B2
(45) Date of Patent: Jul. 6, 2010

(54) ORGANIC ELECTRO-LUMINESCENCE DISPLAY APPARATUS

(75) Inventors: Ming-Tan Hsu, Chengnan Village (TW); I-Cheng Shih, Lujhu Township, Taoyuan County (TW); Tai-Ming Lin, Taipei (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 1106 days.

(21) Appl. No.: 11/221,610

(22) Filed: Sep. 7, 2005

(65) Prior Publication Data

US 2007/0052645 A1    Mar. 8, 2007

(51) Int. Cl.
G09G 3/30    (2006.01)

(52) U.S. Cl. .................. 345/76; 345/82; 315/169.3

(58) Field of Classification Search ............. 345/76–82, 345/92, 94, 100, 208; 315/169.3; 313/498, 313/505; 257/258
See application file for complete search history.

(56) References Cited

U.S. PATENT DOCUMENTS

| | | | |
|---|---|---|---|
| 7,425,937 B2 * | 9/2008 | Inukai | 345/76 |
| 7,446,741 B2 * | 11/2008 | Park | 345/76 |
| 2003/0059525 A1 | 3/2003 | Moon | 427/66 |

* cited by examiner

Primary Examiner—Abbas I Abdulselam
(74) Attorney, Agent, or Firm—J.C. Patents

(57) ABSTRACT

An organic electro-luminescence display apparatus including a substrate, data lines and scan lines, a plurality of first, second and third organic electro-luminescence units, at least one first source driver, second source driver and third source driver and a gate driver is provided. Data lines and scan lines are disposed on the substrate to define a plurality of pixel areas. Each first, second, and third organic electro-luminescence unit is disposed in corresponding pixel area. Each first, second, and third organic electro-luminescence unit is electrically connected with one of the data lines and scan lines correspondingly. Each source driver is disposed at one side of the substrate. The data lines electrically connected with the first, second and third organic electro-luminescence units are electrically connected with corresponding source drivers. The gate driver is disposed at another side of the substrate and electrically connected with the scan lines. The luminous efficiency can be enhanced.

8 Claims, 4 Drawing Sheets

ORGANIC ELECTRO-LUMINESCENCE DISPLAY APPARATUS

BACKGROUND OF THE INVENTION

1. Field of the Invention

The present invention relates to an organic electro-luminescence display apparatus. More particularly, the present invention relates to an organic electro-luminescence display apparatus capable of driving each organic electro-luminescence unit efficiently.

2. Description of Related Art

An organic electro-luminescence display apparatus is a display device by utilizing the self-luminescent characteristics of organic luminescent materials to display. The luminescent structure of the organic electro-luminescence display apparatus is mainly comprises a pair of electrodes (a cathode and an anode) and an organic luminescent layer. Concerned with the luminescent principle of the organic electro-luminescence display apparatus, it involves the followings. First, the organic molecules will be excited by the combination of electrons and holes while currents are passed through the cathodes and the anodes. And then different color light will be emitted from the organic luminescence layer according to different characteristics of organic light emitting materials while the organic molecules release energy from the excited state to the ground state.

FIG. 1 is a schematic view of an elementary circuit configuration of a pixel unit in an active matrix organic electro-luminescence display apparatus. Referring to FIG. 1, a gate driver 110 provides a scan line 130 with a voltage for opening an active element 150. Similarly, a source driver 120 provides a data line 140 with a data voltage to be stored in a storage capacitor 160 for opening another active element 170. So the currents come from node Vd can be transmitted into an organic electro-luminescence unit 180 and then the organic electro-luminescence unit 180 is driven to emit light. The drive element of the organic electro-luminescence display apparatus utilizes the driving method for liquid crystal display apparatus directly because the driving method for the aforementioned active matrix organic electro-luminescence display apparatus is similar to that for general active matrix liquid crystal display apparatus.

FIG. 2 is a schematic view of a conventional organic electro-luminescence display apparatus. Referring to FIG. 2, an organic electro-luminescence display apparatus 200 comprises a substrate 210, a plurality of data lines 222 and scan lines 224, a plurality of red light (R), green light (G) and blue light (B) organic electro-luminescence units 242, 244 and 246, a first source driver 252, a second source driver 254, a third source driver 256 and a gate driver 260.

The data lines 222 and the scan lines 224 are disposed on the substrate 210, and a plurality of pixel areas 230 are defined by the data lines 222 and the scan lines 224 on the substrate 210. The red light, green light and blue light organic electro-luminescence units 242, 244 and 246 are disposed in the pixel areas 230 respectively. It should be noted that the first, second and third source drivers 252, 254 and 256 are disposed at the same side 210a of the substrate 210, wherein the first, second and third source drivers 252, 254 and 256 are coupled with the data lines 222 in sections 272, 274 and 276 correspondingly. And then the red light, green light and blue light organic electro-luminescence units 242, 244 and 246 located in sections 272, 274 and 276 respectively will be driven by the same data voltages.

However, the characteristics of organic luminescence layers in the red light, green light and blue light organic electro-luminescence units 242, 244 and 246 are so different. Therefore, the optimal luminous efficiency can not be achieved by each of the organic electro-luminescence units 242, 244 and 246 because the red light, green light and blue light organic electro-luminescence units 242, 244 and 246 are driven by the same data voltages. So the display quality of the organic electro-luminescence display apparatus will be further restrained.

SUMMARY OF THE INVENTION

Accordingly, the present invention is directed to an organic electro-luminescence display apparatus capable of driving each organic electro-luminescence unit efficiently via different voltages so as to enhance its luminous efficiency and display quality.

According to an embodiment of the present invention, the organic electro-luminescence display apparatus is disclosed. It comprises a substrate, a plurality of data lines and scan lines, a plurality of first, second and third organic electro-luminescence units, at least one first source driver, second source driver and third source driver and a gate driver. The data lines and the scan lines are disposed on the substrate, wherein a plurality of pixel areas are defined by the data lines and the scan lines on the substrate. The first, second and third organic electro-luminescence units are disposed in the pixel areas correspondingly, wherein each first, second, and third organic electro-luminescence unit is electrically connected with one of the data lines and one of the scan lines correspondingly. The first source driver is disposed at one side of the substrate, wherein the data lines electrically connected with the first organic electro-luminescence units are electrically connected with the first source driver. The second source driver is disposed at one side of the substrate, wherein the data lines electrically connected with the second organic electro-luminescence units are electrically connected with the second source driver. The third source driver is disposed at one side of the substrate, wherein the data lines electrically connected with the third organic electro-luminescence units are electrically connected with the third source driver. The gate driver is disposed at another side of the substrate, wherein the gate driver is electrically connected with the scan lines.

According to an embodiment of the present invention, the first and second source drivers are disposed at the same one side of the substrate, and the third source driver is disposed at another side of the substrate.

According to an embodiment of the present invention, the organic electro-luminescence display apparatus further comprises a plurality of first leads and a plurality of second leads. The first leads are disposed between the first source driver and the data lines which are electrically connected with the first organic electro-luminescence units. The second leads are disposed between the second source driver and the data lines which are electrically connected with the second organic electro-luminescence units, wherein the first leads and the second leads are located on different layers.

According to an embodiment of the present invention, the organic electro-luminescence display apparatus further comprises a plurality of third leads. The third leads are disposed between the third source driver and the data lines which are electrically connected with the third organic electro-luminescence units, and the third leads and the first leads or the second leads are located on the same layer.

According to an embodiment of the present invention, the first, second and third organic electro-luminescence units are red light, green light and blue light organic electro-luminescence units respectively.

According to an embodiment of the present invention, each of the first, second and third organic electro-luminescence units comprises an active element and an organic light emitting diode (OLED), wherein the OLED is electrically connected with the active element.

According to an embodiment of the present invention, the active element comprises at least one thin film transistor.

According to an embodiment of the present invention, each of the first, second and third organic electro-luminescence units is a top emission type-organic electro-luminescence unit.

According to an embodiment of the present invention, each of the first, second and third organic electro-luminescence units is a bottom emission type-organic electro-luminescence unit.

To sum up, the different color organic electro-luminescence units will be driven respectively because a particular circuit layout configuration is utilized by the present invention, the organic electro-luminescence display apparatus. Therefore, the different color organic electro-luminescence units can be driven correspondingly via optimal voltages provided by the source drivers. So the luminous efficiency and display quality of the organic electro-luminescence display apparatus will be enhanced effectively.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Various specific embodiments of the present invention are disclosed below, illustrating examples of various possible implementations of the concepts of the present invention. The following description is made for the purpose of illustrating the general principles of the invention and should not be taken in a limiting sense. The scope of the invention is best determined by reference to the appended claims.

Figure 1:
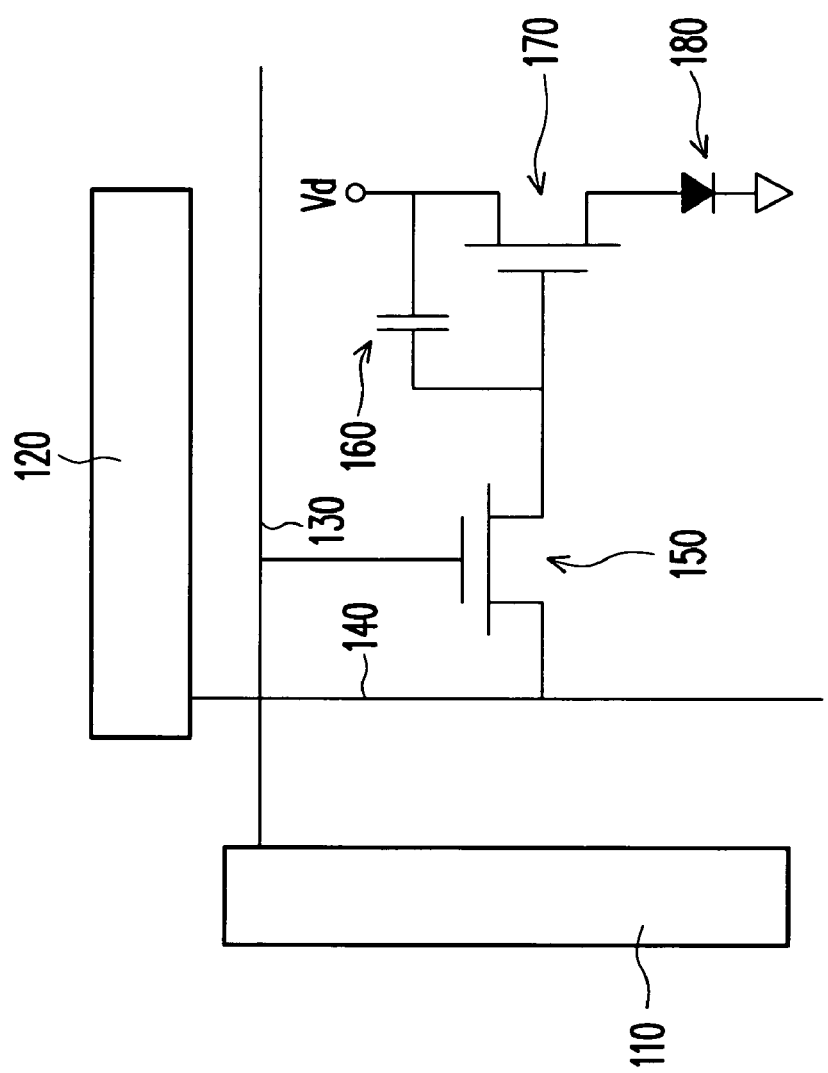
FIG. 1 is a schematic view of an elementary circuit configuration of a pixel unit in a conventional active matrix organic electro-luminescence display apparatus.
Figure 2:
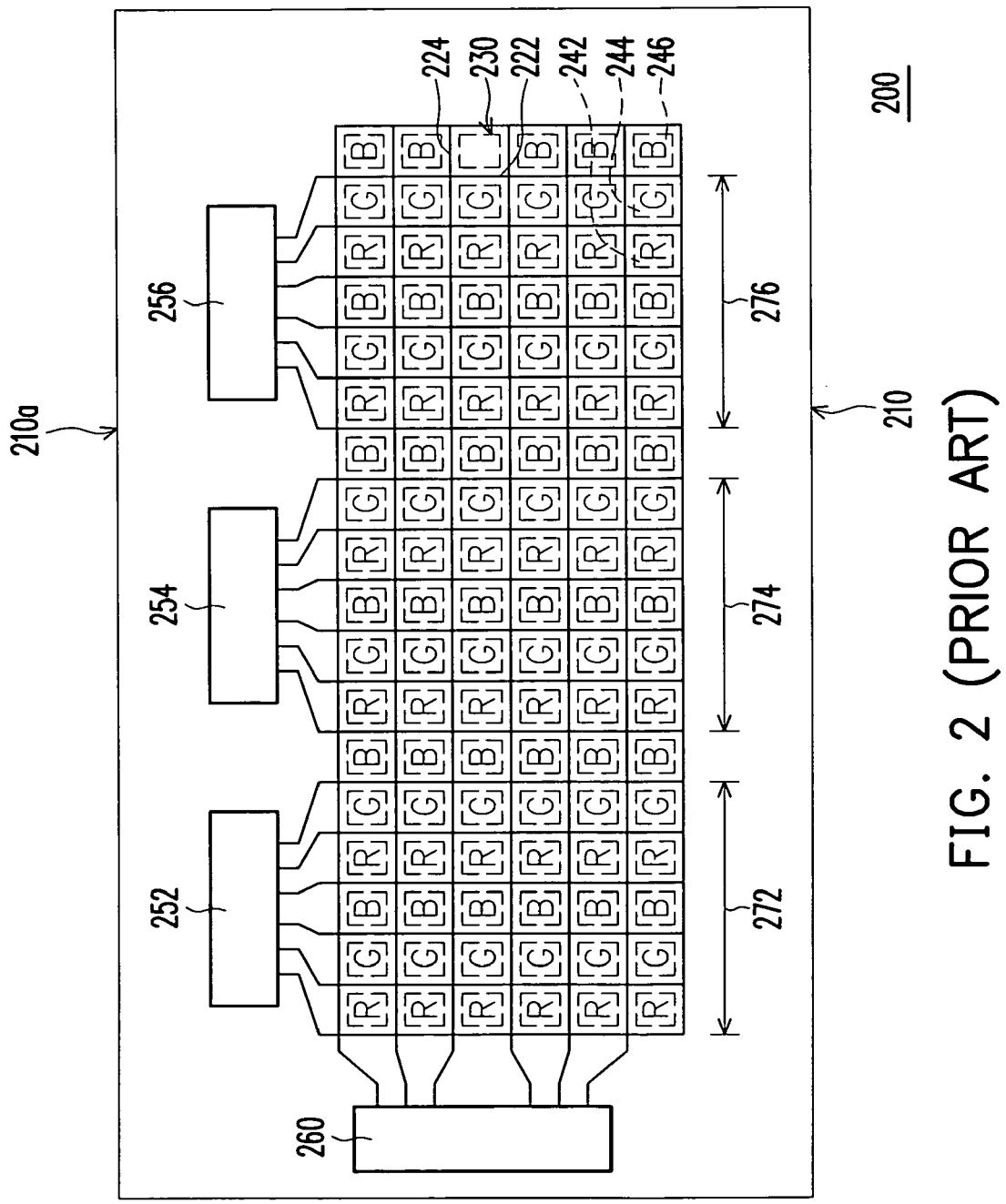
FIG. 2 is a schematic view of a conventional organic electro-luminescence display apparatus.
Figure 3:
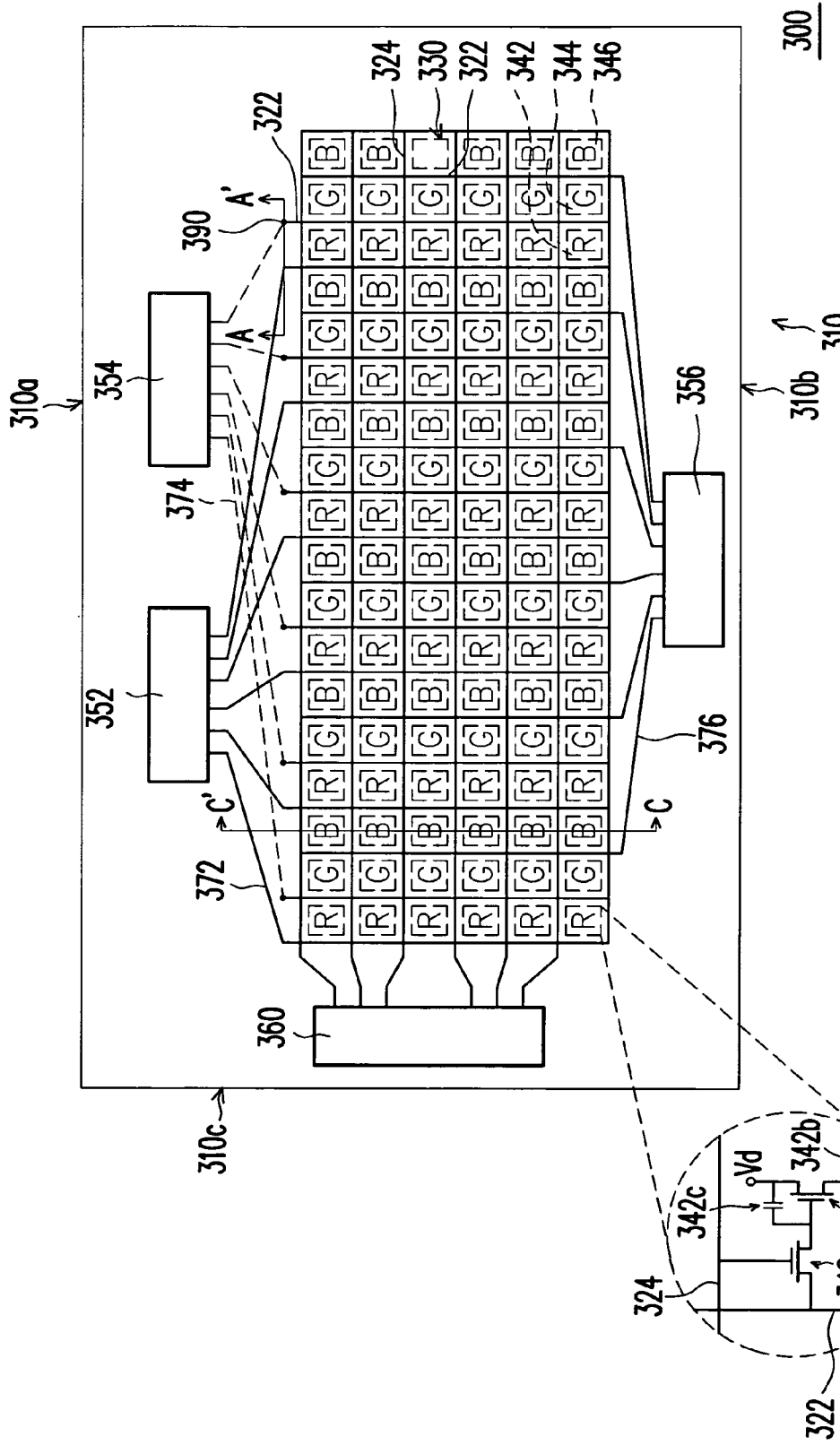
FIG. 3 is a schematic view of an organic electro-luminescence display apparatus according to one embodiment of the present invention.

FIG. 3 is a schematic view of an organic electro-luminescence display apparatus according to one embodiment of the present invention. Referring to FIG. 3, the organic electro-luminescence display apparatus 300 comprises a substrate 310, a plurality of data lines 322 and scan lines 324, a plurality of first, second and third organic electro-luminescence units 342, 344 and 346, at least one first source driver 352, at least one second source driver 354, at least one third source driver 356 and a gate driver 360.

Referring to FIG. 3, the data lines 322 and the scan lines 324 are disposed on the substrate 310, wherein a plurality of pixel areas 330 are defined by the data lines 322 and the scan lines 324 on the substrate 310. The first, second and third organic electro-luminescence units 342, 344 and 346 are disposed in the pixel areas 330 correspondingly, wherein each first, second, and third organic electro-luminescence unit 342, 344 and 346 is electrically connected with one of the data lines 322 and one of the scan lines 324 correspondingly. In one embodiment, the first, second and third organic electro-luminescence units 342, 344 and 346 are red light (R), green light (G) and blue light (B) organic electro-luminescence units respectively, for example. Certainly, the color light of the first, second and third organic electro-luminescence units 342, 344 and 346 are not limited in the present invention. The color light of the first, second and third organic electro-luminescence units 342, 344 and 346 can be trichromatic color lights, such as magenta light, cyan light and yellow light.

Additionally, in one embodiment, each of the first, second and third organic electro-luminescence units 342, 344 and 346 comprises an active element and an organic light emitting diode (OLED), but only the active element 342a and the OLED 342b of the first organic electro-luminescence units 342 are shown in FIG. 3. As shown in FIG. 3, the OLED 342b is electrically connected with the active element 342a, wherein the active element 342a comprises a thin film transistor (TFT), for example.

Referring to FIG. 3, the first source driver 352 is disposed at one side of the substrate 310, wherein the data lines 322 electrically connected with the first organic electro-luminescence units 342 are electrically connected with the first source driver 352. The second source driver 354 is disposed at one side of the substrate 310, wherein the data lines 322 electrically connected with the second organic electro-luminescence units 344 are electrically connected with the second source driver 354. The third source driver 356 is disposed at one side of the substrate 310, wherein the data lines 322 electrically connected with the third organic electro-luminescence units 346 are electrically connected with the third source driver 356.

In other words, the first, second and third source drivers 352, 354 and 356 are electrically connected with the first, second and third organic electro-luminescence units 342, 344 and 346 respectively. Therefore, corresponding to different color light organic luminescence layers (such as R-G-B shown in FIG. 3), the different voltages can be applied from the first, second and third source drivers 352, 354 and 356 to the first, second and third organic electro-luminescence units 342, 344 and 346 respectively according to the gamma curve of the first, second and third source drivers 352, 354 and 356 correspondingly. Hence the optimal voltages can be applied to different kinds of organic electro-luminescence units respectively, so as to enhance the luminous efficiency and then the display quality will be improved. In order to enhance the resolution of the display panel of the organic electro-luminescence display apparatus 300, it should be noted that more than one first source driver 352, second source driver 354 and third source driver 356 can be disposed to drive the corresponding organic electro-luminescence units.

As for the disposition of the first, second and third source drivers 352, 354 and 356, it has several types. In one embodiment, the first and second source drivers 352 and 354 are disposed at the same one side 310a of the substrate 310, and the third source driver 356 is disposed at another side 310b of the substrate 310. Certainly, the first and third source drivers 352 and 356 can be disposed at the same one side of the substrate 310, and the second source driver 354 can be disposed at another side of the substrate 310 (not shown). In another embodiment, the second and third source drivers 354 and 356 can be disposed at the same one side of the substrate 310, and the first source driver 352 can be disposed at another side of the substrate 310 (not shown).

Referring to FIG. 3, in one embodiment, the organic electro-luminescence display apparatus 300 further comprises a plurality of first leads 372 and a plurality of second leads 374, for instance. The first leads 372 are disposed between the first source driver 352 and the data lines 322 which are electrically connected with the first organic electro-luminescence units 342. The second leads 374 are disposed between the second source driver 354 and the data lines 322 which are electrically connected with the second organic electro-luminescence units 344, wherein the first leads 372 and the second leads 374 are located on different layers.

Specifically, the first and second leads 372 and 374 are required to be disposed on different layers to avoid the contact with the first and second leads 372 and 374 (i.e. to prevent from short circuit) while the source drivers 352 and 354 located on the same side 310a are coupled with the organic electro-luminescence units 342, 344 correspondingly.

Figure 3A:
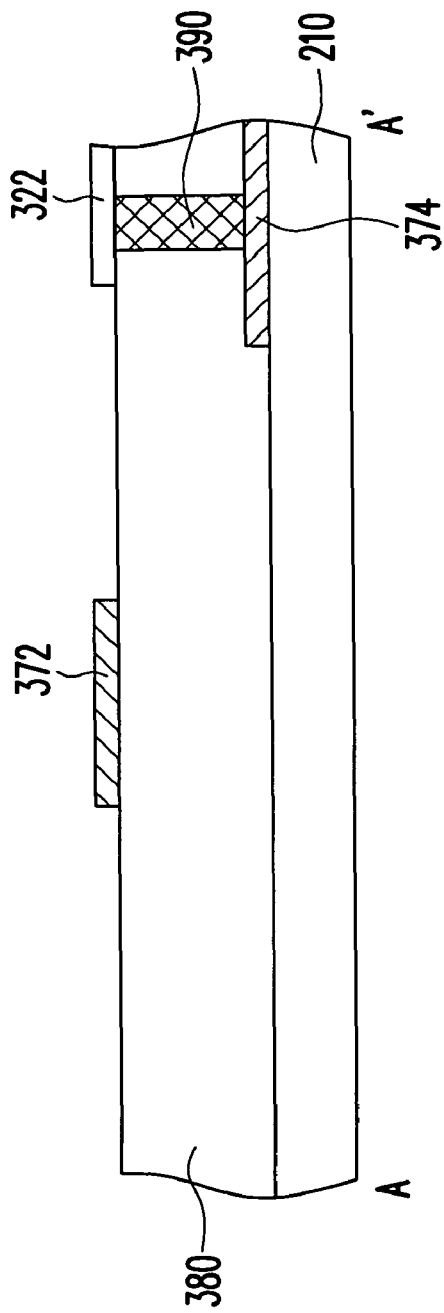
FIG. 3A is a partial cross-sectional view taken along line A-A' in FIG. 3.

FIG. 3A is a partial cross-sectional view taken along line A-A' in FIG. 3. Referring to FIG. 3A, described in detail, the second leads 374 are located on the substrate 210 and an insulating layer 380 is disposed between the first leads 372 and the second leads 374 to avoid the short circuit thereof. The second leads 374 are electrically connected with the data lines 322 via a plug 390, wherein the second leads 374 and the data lines 322 are disposed on different layers.

Figure 3B:
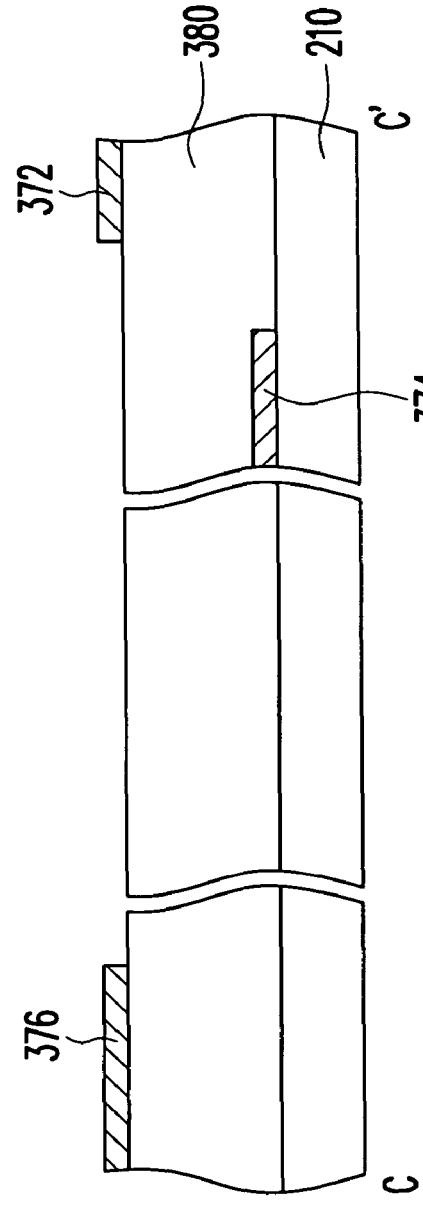
FIG. 3B is a partial cross-sectional view taken along line C-C' in FIG. 3.

Furthermore, the organic electro-luminescence display apparatus 300 further comprises a plurality of third leads 376a, for example. The third leads 376 are disposed between the third source driver 356 and the data lines 322 which are electrically connected with the third organic electro-luminescence units 346, and the third leads 376 and the above-mentioned first leads 372 or the second leads 374 are located on the same layer. FIG. 3B is a partial cross-sectional view taken along line C-C' in FIG. 3. Referring to FIG. 3B, the third leads 376 and the first leads 372 are located on the same layer, for instance.

Referring to FIG. 3, the gate driver 360 is disposed at another side 310c of the substrate 310, wherein the gate driver 360 is electrically connected with the scan lines 324. As shown the schematic view of circuit in FIG. 3, while the gate driver 360 provides the scan lines 324 with a voltage for opening the active element 342a. Similarly, the source driver 352 provides the data lines 322 with a data voltage to be stored in a storage capacitor 342c for opening another active element 342d. So the currents come from node Vd can be transmitted into the OLED 342b and then the OLED 342b is driven to emit light.

As shown in FIG. 3, in one embodiment, each of the first, second and third organic electro-luminescence units 342, 344 and 346 can be a top emission type-organic electro-luminescence unit. And the first, second and third organic electro-luminescence units 342, 344 and 346 on the substrate 310 are arranged from the left side to the right side of the substrate 310 in a sequence, i.e. red light, green light and blue light. In another embodiment, each of the first, second and third organic electro-luminescence units 342, 344 and 346 can be a bottom emission type-organic electro-luminescence unit. And the first, second and third organic electro-luminescence units 342, 344 and 346 on the substrate 310 are arranged from the left side to the right side of the substrate 310 in another sequence, i.e. blue light, green light and red light. Certainly, the first, second and third organic electro-luminescence units 342, 344 and 346 can be arranged into different types to meet with the desired luminous quality or requirement.

In summary, the present invention, the organic electro-luminescence display apparatus, has the following advantages:

Because the different color light organic electro-luminescence units can be driven correspondingly by optimal voltages provided by the source drivers according to different characteristics of organic electro-luminescence units in the present invention, the luminous efficiency of the organic electro-luminescence display apparatus can be adjusted efficiently and then the display quality of the organic electro-luminescence display apparatus will be further enhanced.

The above description provides a full and complete description of the embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. An organic electro-luminescence display apparatus, comprising:
   a substrate;
   a plurality of data lines and a plurality of scan lines, disposed on the substrate, wherein a plurality of pixel areas are defined by the data lines and the scan lines on the substrate;
   a plurality of red light, green light and blue light organic electro-luminescence units, disposed in the pixel areas correspondingly, wherein each red light, green light and blue light organic electro-luminescence unit is electrically connected with one of the data lines and one of the scan lines correspondingly;
   at least one first source driver, disposed at one side of the substrate, wherein the data lines electrically connected with the red organic electro-luminescence units are electrically connected with the first source driver;
   at least one second source driver, disposed at one side of the substrate, wherein the data lines electrically connected with the green organic electro-luminescence units are electrically connected with the second source driver;
   at least one third source driver, disposed at one side of the substrate, wherein the data lines electrically connected with the blue organic electro-luminescence units are electrically connected with the third source driver, wherein the red light, green light and blue light organic electro-luminescence units are respectively applied with different voltages according to gamma curves of the first, second and third source drivers correspondingly; and
   a gate driver, disposed at another side of the substrate, wherein the gate driver is electrically connected with the scan lines,
   wherein the plurality of pixel areas are arranged as rows and columns, and the red light, green light and blue light organic electro-luminescence units are disposed with respective same columns corresponding only to their respective data lines.

2. The organic electro-luminescence display apparatus of claim 1, wherein the first and second source drivers are disposed at the same one side of the substrate, and the third source driver is disposed at another side of the substrate.

3. The organic electro-luminescence display apparatus of claim 2, further comprising:
   a plurality of first leads, disposed between the first source driver and the data lines which are electrically connected with the red organic electro-luminescence units; and a plurality of second leads, disposed between the second source driver and the data lines which are electrically connected with the green organic electro-luminescence units, wherein the first leads and the second leads are located on different layers.

4. The organic electro-luminescence display apparatus of claim 3, further comprising:

a plurality of third leads, disposed between the third source driver and the data lines which are electrically connected with the blue organic electro-luminescence units, and the third leads and the first leads or the second leads are located on the same layer.

5. The organic electro-luminescence display apparatus of claim 1, wherein each of the red light, green light and blue light organic electro-luminescence units comprises:

an active element; and an organic light emitting diode (OLED), electrically connected with the active element.

6. The organic electro-luminescence display apparatus of claim 5, wherein the active element comprises at least one thin film transistor.

7. The organic electro-luminescence display apparatus of claim 1, wherein each of the red light, green light and blue light organic electro-luminescence units is a top emission type-organic electro-luminescence unit.

8. The organic electro-luminescence display apparatus of claim 1, wherein each of the red light, green light and blue light organic electro-luminescence units is a bottom emission type-organic electro-luminescence unit.

* * * * *